US008750423B2

(12) United States Patent
Hamada et al.

(10) Patent No.: US 8,750,423 B2
(45) Date of Patent: Jun. 10, 2014

(54) RECEIVING APPARATUS, DATA TRANSFER APPARATUS, DATA RECEIVING METHOD AND NON-TRANSITORY COMPUTER READABLE RECORDING MEDIUM

(75) Inventors: Tsutomu Hamada, Kanagawa (JP); Manabu Akamatsu, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 13 days.

(21) Appl. No.: 13/104,447

(22) Filed: May 10, 2011

(65) Prior Publication Data
US 2012/0144257 A1 Jun. 7, 2012

(30) Foreign Application Priority Data

Dec. 7, 2010 (JP) ................................. 2010-272420

(51) Int. Cl.
*H04L 27/00* (2006.01)
*H03M 13/00* (2006.01)
*G06F 11/07* (2006.01)

(52) U.S. Cl.
USPC ................... 375/316; 714/746; 714/E11.023

(58) Field of Classification Search
None
See application file for complete search history.

(56) References Cited

U.S. PATENT DOCUMENTS

| 4,434,459 | A | * | 2/1984 | Holland et al. ............... 712/210 |
| 5,387,911 | A | * | 2/1995 | Gleichert et al. ............... 341/95 |
| 5,408,476 | A | * | 4/1995 | Kawai et al. ................... 714/775 |
| 5,687,181 | A | | 11/1997 | Suemura et al. |
| 6,389,572 | B1 | * | 5/2002 | Garrabrant et al. ........... 714/780 |
| 6,779,148 | B2 | * | 8/2004 | Tanaka .......................... 714/753 |
| 7,103,830 | B1 | * | 9/2006 | Dong ............................. 714/784 |
| 7,535,957 | B2 | * | 5/2009 | Ozawa et al. .................. 375/238 |
| 7,573,916 | B1 | * | 8/2009 | Bechtolsheim et al. ...... 370/542 |
| 7,802,167 | B1 | * | 9/2010 | Gorshe .......................... 714/762 |
| 8,099,653 | B2 | * | 1/2012 | Kanda et al. .................. 714/776 |
| 8,218,510 | B2 | * | 7/2012 | Kim et al. ...................... 370/337 |
| 8,291,254 | B2 | * | 10/2012 | Chard et al. ................... 713/500 |
| 2003/0016758 | A1 | * | 1/2003 | Wu et al. ........................ 375/259 |
| 2003/0185251 | A1 | * | 10/2003 | Ichino et al. .................. 370/535 |
| 2003/0235298 | A1 | * | 12/2003 | Hanounik ....................... 380/29 |
| 2004/0083419 | A1 | * | 4/2004 | Chiba et al. ................... 714/799 |
| 2004/0153952 | A1 | * | 8/2004 | Sharma et al. ................ 714/781 |
| 2005/0190690 | A1 | * | 9/2005 | Tran .............................. 370/216 |
| 2007/0139232 | A1 | * | 6/2007 | Venkata et al. ................. 341/50 |

(Continued)

FOREIGN PATENT DOCUMENTS

JP  A 5-227041   9/1993
JP  A 7-273742   10/1995

(Continued)

*Primary Examiner* — Chieh M Fan
*Assistant Examiner* — Bahman Badipour
(74) *Attorney, Agent, or Firm* — Oliff PLC

(57) ABSTRACT

A data receiving device includes a receiving unit, an inverse conversion unit and an error correction unit. The receiving unit receives converted data, which is obtained by converting data including transfer data of a plurality of bits, and an error detection code for error detection of the transfer data, according to a predetermined first procedure. The inverse conversion unit inversely converts the received converted data according to a predetermined second procedure. If it is impossible for the inverse conversion unit to inversely convert the converted data, if it is possible for the inverse conversion unit to inversely convert inverted data obtained by inverting a portion of the bits of the converted data, and if an error is not detected in data obtained by inversely converting the inverted data based on the error detection code, the error correction unit performs error correction by inversely converting the inverted data.

6 Claims, 7 Drawing Sheets

(56) References Cited

U.S. PATENT DOCUMENTS

| | | | |
|---|---|---|---|
| 2007/0177701 A1* | 8/2007 | Thanigasalam | 375/372 |
| 2007/0198904 A1* | 8/2007 | Yoshida | 714/785 |
| 2008/0045151 A1* | 2/2008 | Goto et al. | 455/60 |
| 2008/0163011 A1* | 7/2008 | Krans | 714/712 |
| 2008/0294966 A1 | 11/2008 | Kuroishi et al. | |
| 2009/0063936 A1* | 3/2009 | Kanda et al. | 714/776 |
| 2009/0323727 A1* | 12/2009 | Surek | 370/503 |
| 2010/0050049 A1* | 2/2010 | Lin et al. | 714/758 |
| 2010/0246699 A1* | 9/2010 | Moriizumi | 375/260 |
| 2010/0251043 A1* | 9/2010 | Anzou et al. | 714/719 |
| 2011/0050490 A1* | 3/2011 | Matsue | 342/357.23 |
| 2012/0087182 A1* | 4/2012 | Kim et al. | 365/163 |
| 2013/0227370 A1* | 8/2013 | Hamada | 714/746 |

FOREIGN PATENT DOCUMENTS

| | | | | |
|---|---|---|---|---|
| JP | A 8-251143 | | 9/1996 | |
| JP | A 9-098093 | | 4/1997 | |
| JP | A 10-013251 | | 1/1998 | |
| JP | 2001186108 | * | 7/2001 | H03M 13/15 |
| JP | A 2003-204363 | | 7/2003 | |
| JP | A 2008-294757 | | 12/2008 | |

* cited by examiner

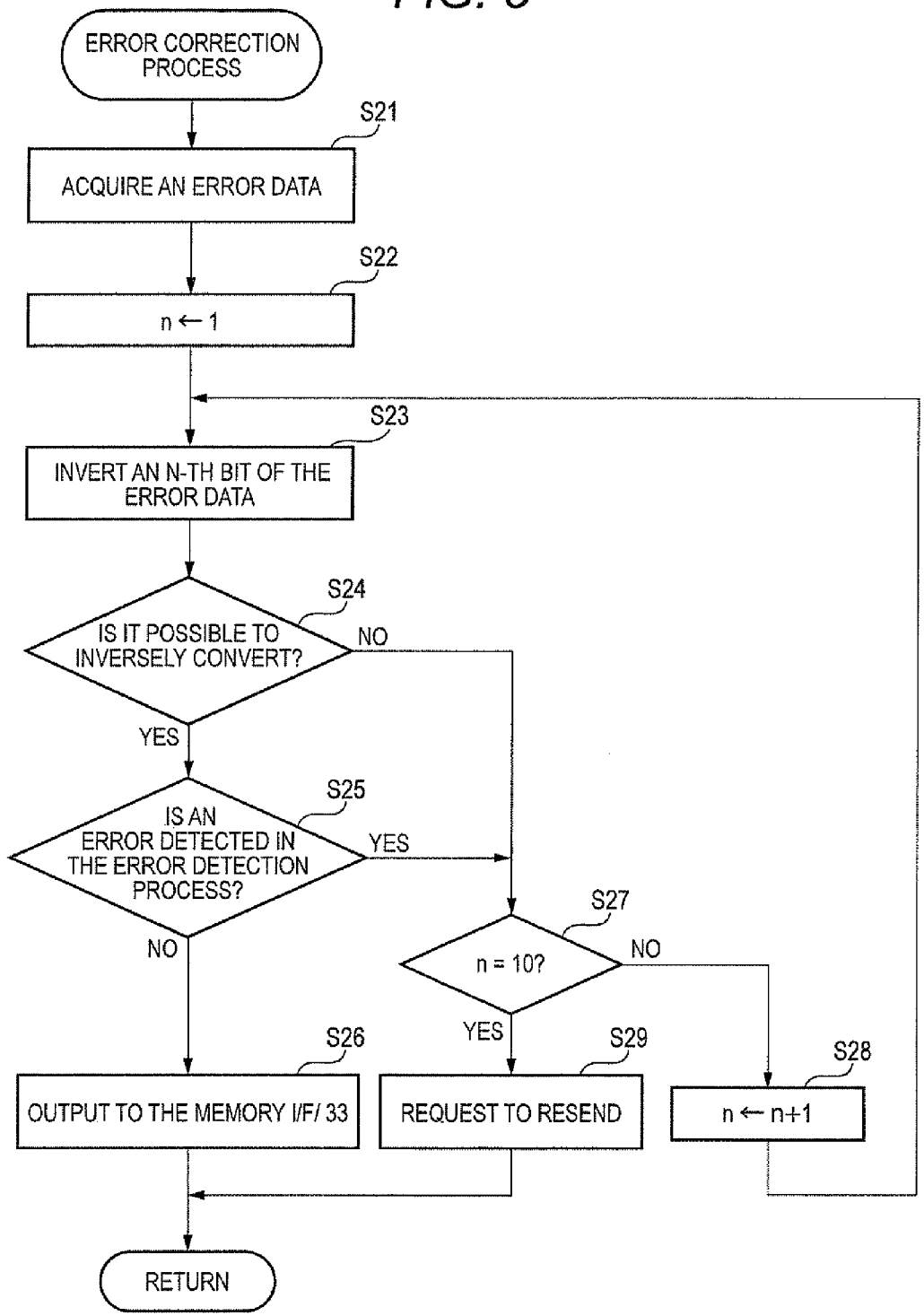

FIG. 6A

TRANSMISSION DATA

| 0010111011 |

RECEPTION DATA

| 0010110011 |

FIG. 6B

| 10-BIT DATA (INVERTED DATA) | | 8-BIT DATA |
|---|---|---|
| 0010110010 | → | — |
| 0010110001 | → | — |
| 0010110111 | → | 244 |
| 0010111011 | → | 20 |
| 0010100011 | → | — |
| 0010010011 | → | — |
| 0011110011 | → | — |
| 0000110011 | → | — |
| 0110110011 | → | 112 |
| 1010110011 | → | 127 |

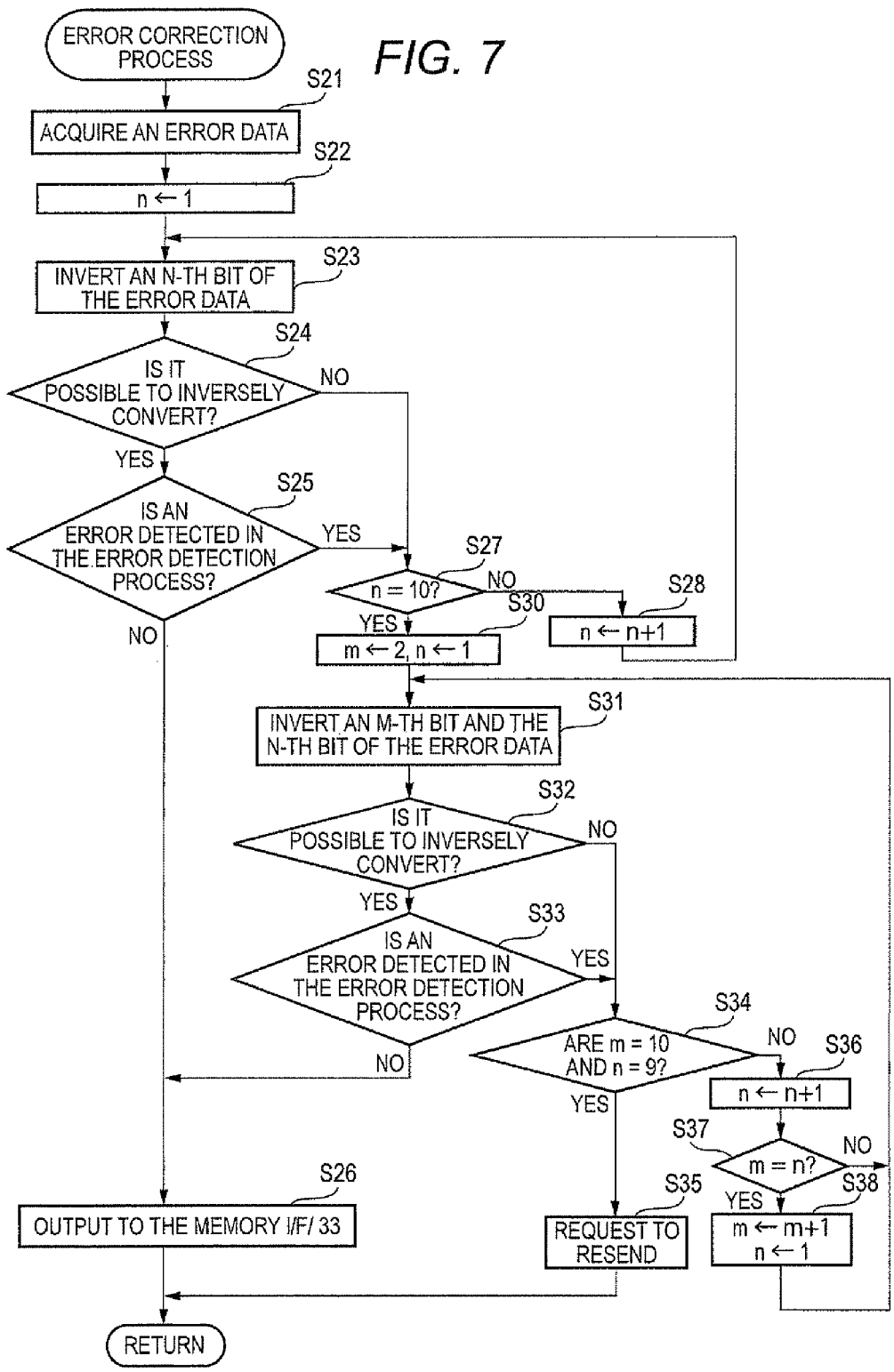

RECEIVING APPARATUS, DATA TRANSFER APPARATUS, DATA RECEIVING METHOD AND NON-TRANSITORY COMPUTER READABLE RECORDING MEDIUM

CROSS-REFERENCE TO RELATED APPLICATIONS

This application is based on and claims priority under 35 USC 119 from Japanese Patent Application No. 2010-272420 filed on Dec. 7, 2010.

BACKGROUND

Technical Field

The present disclosure relates to a receiving apparatus, a data transfer apparatus, a data receiving method and a computer readable medium storing a program.

SUMMARY

According to an aspect of the invention, a data receiving device includes a receiving unit, an inverse conversion unit and an error correction unit. The receiving unit receives converted data, which is obtained by converting data including transfer data of a plurality of bits, and an error detection code for error detection of the transfer data, according to a predetermined first procedure. The inverse conversion unit inversely converts the converted data received by the receiving unit according to a predetermined second procedure. If it is impossible for the inverse conversion unit to inversely convert the converted data, if it is possible for the inverse conversion unit to inversely convert inverted data obtained by inverting a portion of the bits of the converted data, and if an error is not detected in data obtained by inversely converting the inverted data based on the error detection code, the error correction unit performs error correction by inversely converting the inverted data.

BRIEF DESCRIPTION OF THE DRAWINGS

Exemplary embodiments of the invention will be described in detail below based on the accompanying drawings, wherein:

FIG. 5 is a flowchart showing an example of an error correction process performed by the error correction section;

FIGS. 6A and 6B are diagrams showing a specific example of error correction performed by the error correction section; and FIG. 7 is a flowchart showing an example of an error correction process performed by an error correction section according to a second exemplary embodiment of the invention.

DETAILED DESCRIPTION

First Exemplary Embodiment

A first exemplary embodiment of the invention will be described with reference to FIGS. 1 to 6.
(Configuration of Data Transfer Apparatus)

Figure 1:
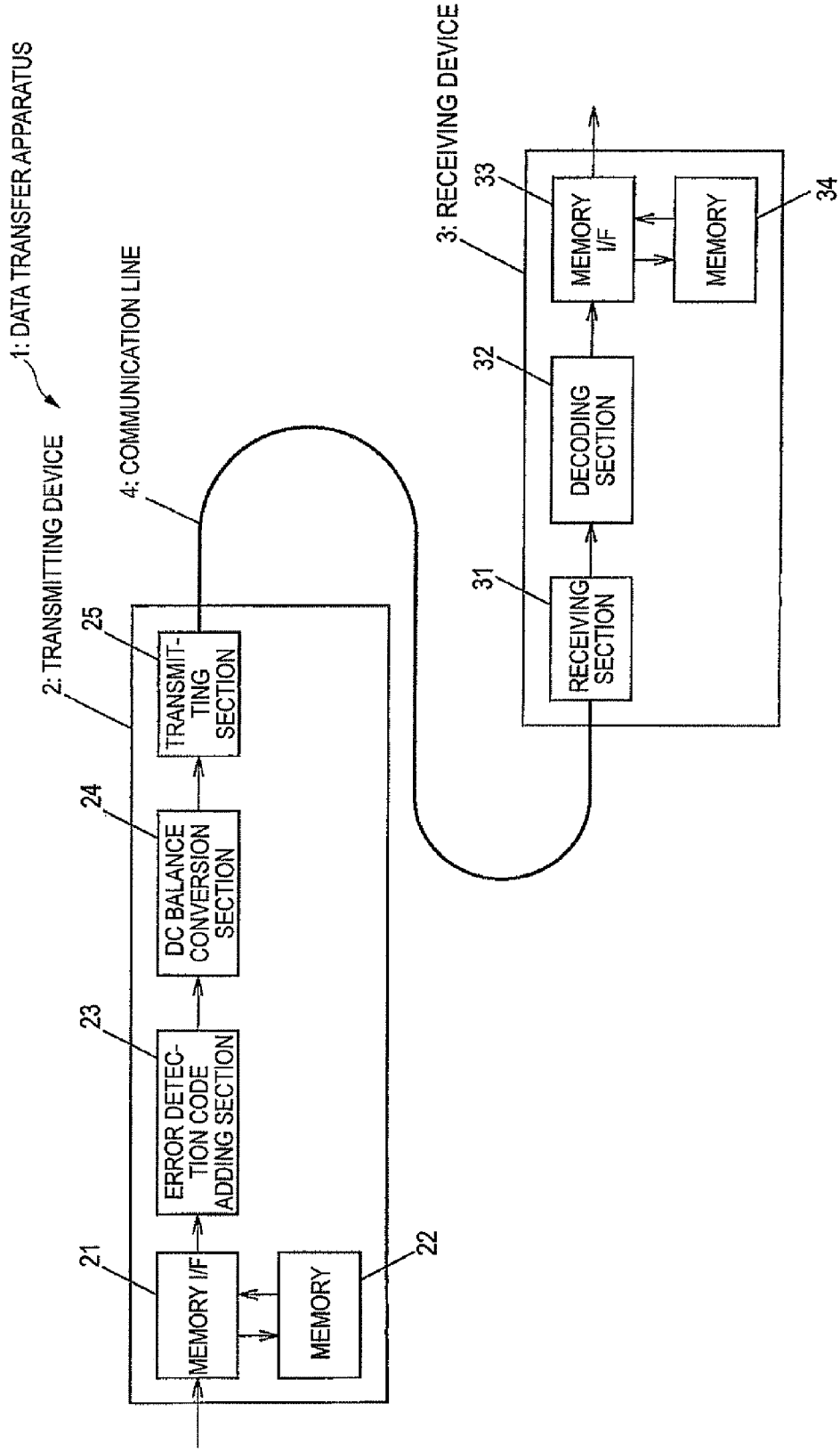
FIG. 1 is a block diagram showing the configuration of a data transfer apparatus according to a first exemplary embodiment of the invention.

FIG. 1 is a block diagram showing the configuration of a data transfer apparatus according to a first exemplary embodiment of the invention. A data transfer apparatus 1 includes a transmitting device 2, a receiving device 3, and a communication line 4 connecting the transmitting device 2 and the receiving device 3. Examples of the communication line 4 include a differential signal line of a pair of signal lines which transmit differential signals whose polarities are opposite to each other.
(Configuration of Transmitting Device)

Transmitting device 2 includes a memory interface 21, a memory 22 connected to memory interface 21, an error detection code adding section 23, a DC balance conversion section 24, and a transmitting section 25.

The memory interface 21 receives data transferred from an external apparatus and temporarily stores the received transfer data in the memory 22 which is implemented by a storage device such as a random access memory (RAM). Further, the memory interface 21 reads the transfer data stored in the memory 22 and outputs the read transfer data to the error detection code adding section 23 at a subsequent stage.

The error detection code adding section 23 generates an error detection code for error detection of the transfer data based on the transfer data output from the memory interface 21. Also, the error detection code adding section 23 adds the generated error detection code, a header, and a footer to the transfer data, and outputs the resultant data to the DC balance conversion section 24 at a subsequent stage.

The error detection code generated and added by the error detection code adding section 23 is a code which enables to detect an error caused by a factor as a noise during data transfer, but which is incapable of performing error correction. As the error detection code, for example, a cyclic redundancy check (CRC) code may be used.

The DC balance conversion section 24 performs DC balance conversion to improve the DC balance for the transfer data and the error detection code, which are output from the error detection code adding section 23 so that a lengthy series of signals of '0' or a lengthy series of signals of '1' does not appear in transmission through the communication line 4.

In the first exemplary embodiment, the case where the 8 B/10 B conversion is applied will be described as an example of the DC balance conversion. The 8 B/10 B conversion converts 8-bit byte data into data in 10-bit unit by referring to a conversion table which is registered in advance. By the 8 B/10 B conversion, for example, 8-bit data of '00000000' is converted into 10-bit data of '1001110100', and 8-bit data of '11111111' is converted into 10-bit data of '1010110001'. Also, by the 8 B/10 B conversion, an overhead of 20% occurs. However, a clock signal for synchronization at a receiving side may be embedded in a bitstream which is serially transmitted, and both of data and clocks can be transmitted through the same signal line.

The DC balance conversion section 24 generates converted data by converting data to be processed into 10-bit data every 8 bits by referring to the conversion table, and outputs the generated data to the transmitting section 25 at a subsequent stage.

The transmitting section 25 performs the parallel/serial conversion for the converted data output from the DC balance conversion section 24, and transmits the serial data to the receiving device 3 through the communication line 4 by a transmission circuit such as a differential transceiver.

Figure 2A:
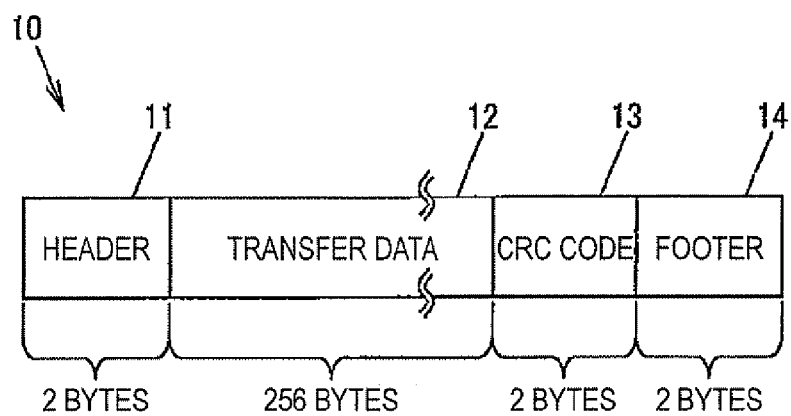
FIGS. 2A and 2B are diagrams showing an example of data before and after a DC balance conversion.
Figure 2B:
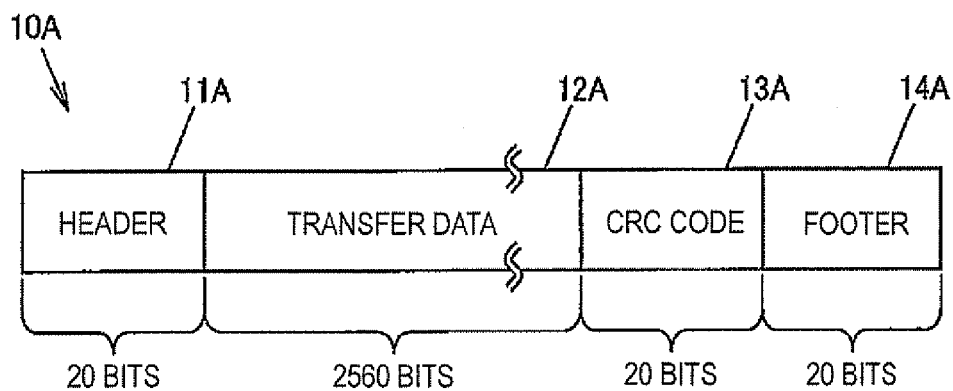

FIG. 2A shows an example of data before the DC balance conversion by the DC balance conversion section 24, and FIG. 2B shows an example of a packet (converted data) for which the DC balance conversion has been performed.

As shown in FIG. 2A, in a packet 10 before the DC balance conversion, a CRC code 13 as the error detection code is added to transfer data 12, and a header 11 and a footer 14 are added to the front and rear of the transfer data 12 and the CRC code 13. In the example shown in the figure, the transfer data 12 are 256 bytes (i.e., 2,048 bits), the CRC code 13 is 2 bytes (i.e., 16 bits), and each of the header 11 and the footer 14 is 2 bytes (i.e., 16 bits).

Also, in a packet 10A after the DC balance conversion, transfer data 12A is 2,560 bits, a CRC code 13A is 20 bits, and each of a header 11A and a footer 14A is 20 bits. The packet 10A is an example of the data converted by the DC balance conversion.

(Configuration of Receiving Device)

The receiving device 3 includes a receiving section 31 connected to the communication line 4, a decoding section 32 that decodes data received by the receiving section 31, a memory interface 33, and a memory 34 connected to the memory interface 33.

The receiving section 31 receives serial data transmitted from the transmitting device 2 through the communication line 4, performs the serial/parallel conversion for the received data, and outputs the parallel data to the decoding section 32 at a subsequent stage.

The decoding section 32 decodes the received data output from the receiving section 31, and extracts the transfer data to output the extracted transfer data to the memory interface 33. Details of the decoding section 32 will be described later.

The memory interface 33 stores the transfer data output from the decoding section 32 in the memory 34 implemented by a storage device such as a RAM. Also, the memory interface 33 outputs the transfer data stored in the memory 34 in response to a reading signal from the outside.

(Configuration of Decoding Section)

Figure 3:
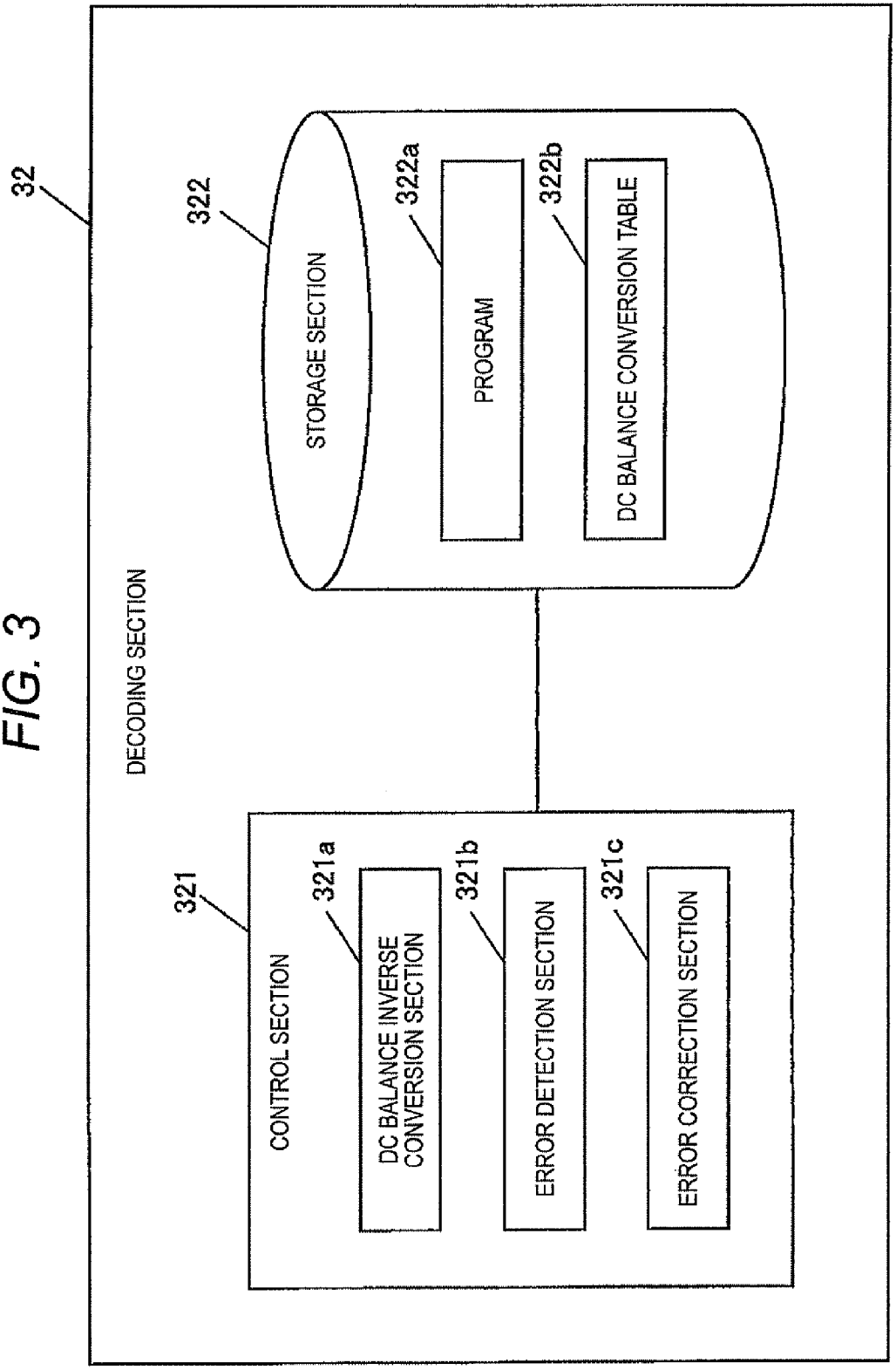
FIG. 3 is a block diagram showing the configuration of a decoding section.

FIG. 3 is a block diagram showing the configuration of the decoding section 32. The decoding section 32 includes a control section 321 implemented by a central processing unit (CPU) and a storage section 322 implemented by a read only memory (ROM) or a RAM.

The control section 321 operates based on a program 322*a* stored in the storage section 322 to thereby serves as a DC balance inverse conversion section 321*a*, an error detection section 321*b*, and an error correction section 321*c*.

The storage section 322 stores the program 322*a* for operating the control section 321 and a DC balance conversion table 322*b*.

The DC balance inverse conversion section 321*a* performs a DC balance inverse conversion for the reception data received by the receiving section 31 by referring to the DC balance conversion table 322*b*, which is stored in the storage section 322 in advance. In the DC balance conversion table 322*b*, contents corresponding to the conversion table which the DC balance conversion section 24 of the transmitting device 2 refers to are set up in advance.

The error detection section 321*b* extracts the transfer data and the error detection code from the resultant data for which the DC balance inverse conversion section 321*a* has performed the DC balance inverse conversion, and checks as to whether or not there is any error in the transfer data has an error by using the error detection code.

When the DC balance inverse conversion by the DC balance inverse conversion section 321*a* is impossible, the error correction section 321*c* generates inverted data acquired by inverting a portion of bits of the data received by receiving section 31. If it is possible to perform the DC balance inverse conversion for the inverted data and if no error is detected through the error detection based on the error detection code, correction data obtained by performing the DC balance inverse conversion for the inverted data are output to the memory interface 33.

(Operation of Decoding Section)

Figure 4:
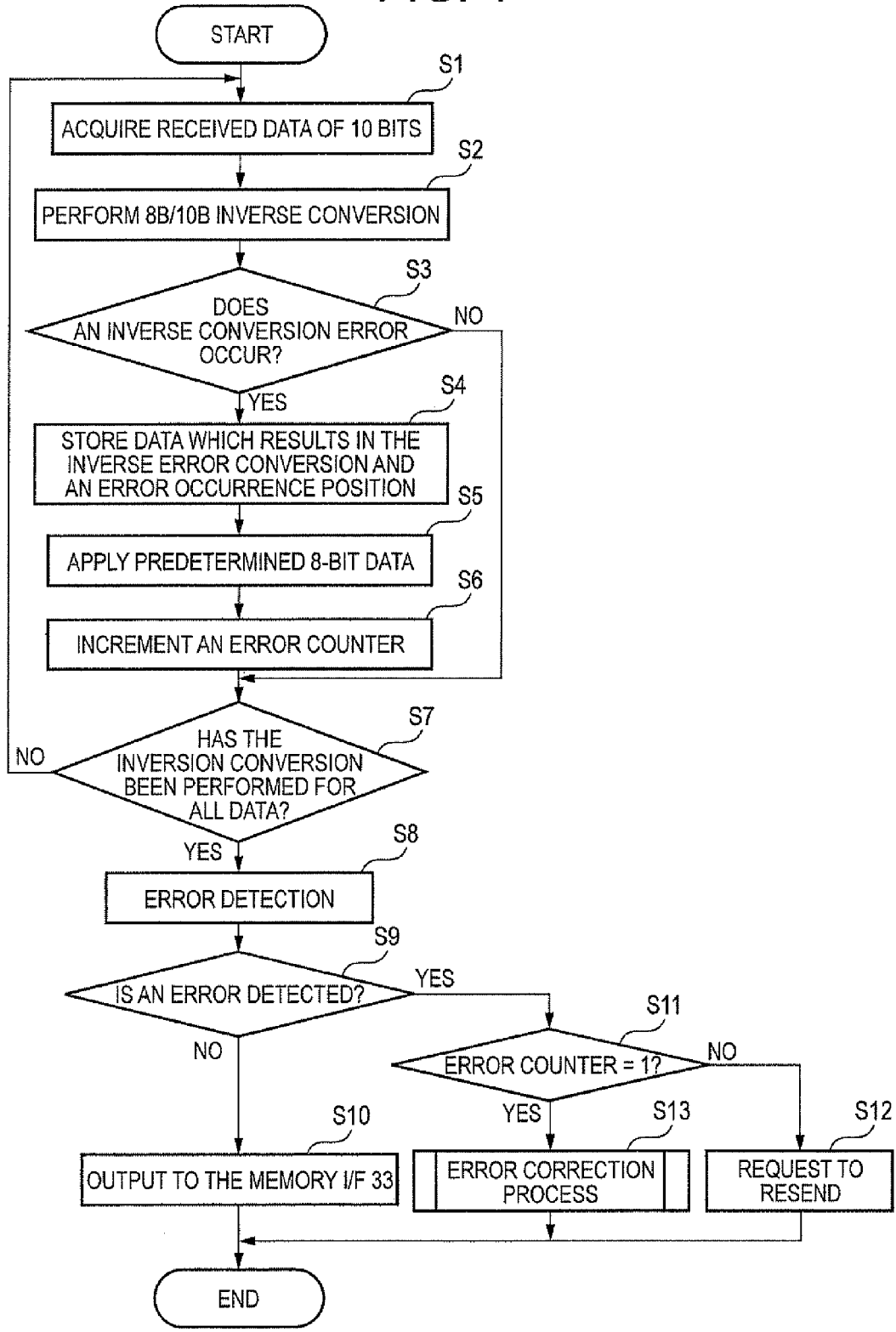
FIG. 4 is a flowchart showing an example of a process performed by a DC balance inverse conversion section, an error detection section, and an error correction section.

FIG. 4 is a flowchart showing an example of a process in which the control section 321 of the decoding section 32 executes with serving as the DC balance inverse conversion section 321*a*, the error detection section 321*b*, and the error correction section 321*c*.

The DC balance inverse conversion section 321*a* acquires the reception data, which has been converted into the parallel data, in the 10-bit data unit from the receiving section 31 (step S1), and inversely converts the acquired data of the 10-bit data unit into 8-bit data by referring to the DC balance conversion table 322*b* (step S2).

At this time, if the reception data has no error, the 8-bit data corresponding to the acquired 10-bit data can be acquired. However, for example, if the reception data has an error due to a factor such as noise, there may be no referable 10-bit data in the DC balance conversion table 322*b*, and an inverse conversion error may occur (step S3: Yes).

In this case, the DC balance inverse conversion section 321*a* stores the data of the 10-bit data unit, which results in the inverse conversion error, and a position of the data (an error occurrence point) in the reception data in the storage section 322 (step S4). Then, the DC balance inverse conversion section 321*a* assumes that the data of the 10-bit data unit is converted into predetermined 8-bit data (e.g., '00000000') (step S5), and increments an error counter (step S6). It is noted that the error counter is initialized to zero in advance.

Next, the DC balance inverse conversion section 321*a* determines as to whether or not the inverse conversion process of step S2 has been performed for all data of one packet received by the receiving section 31 (step S7). If the inverse conversion process has not been performed for all the received data (step S7: No), the processes following step S1 are performed again.

Otherwise, if the DC balance inverse conversion process has been performed for all the received data (step S7: Yes), the error detection section 321*b* performs the error detection process for the transfer data for which the DC balance inverse conversion has been performed, based on the error detection code (step S8). If an error is not detected in the error detection process (step S9: No), the transfer data are output to the memory interface 33 (step S10).

Also, if an error is detected in the error detection process at step S8 (step S9: Yes), it is determined as to whether or not the error counter is equal to 1. If the error counter is not equal to 1 (step S11: No), retransmission of the packet is requested to the transmitting device 2 (step S12).

If the error counter is equal to 1 (step S11: Yes), the error correction section 321*c* performs the error correction process (step S13) which will be described later. Also, if there is data which cannot be inversely converted by the DC balance inverse conversion section 321*a*, such data is treated as converting such data into the predetermined value as described above. Thus, an error is detected in the error detection process at step S8.

FIG. 5 is a flowchart showing an example of the error correction process performed by the error correction section 321c.

The error correction section 321c acquires the 10-bit data (hereinafter, referred to as 'error data') at the error occurrence point, which the DC balance inverse conversion section 321a has stored in the storage section 322 at step S4 (step S21). Then, the error correction section 321c initializes a variable n to 1 (step S22).

Next, the error correction section 321c inverts '0' or '1' of an n-th bit from the least significant bit of the error data acquired at step S21 (step S23).

Subsequently, by referring to the DC balance conversion table 322b, the error correction section 321c determines as to whether or not 8-bit data corresponding to the 10-bit data acquired by inverting the n-th bit at step S23 exist, that is, whether or not the DC balance inverse conversion can be performed for the 10-bit data (step S24).

Next, if the DC balance inverse conversion can be performed (step S24: Yes), the error correction section 321c substitutes the 8-bit data corresponding to the 10-bit data acquired by inverting the n-th bit for the error occurrence point of the data inversely converted by the DC balance inverse conversion section 321a at the process of step S2, and determines as to whether or not the error is detected in the error detection process based on the error detection code (step S25). If an error is not detected (step S25: No), the data is output to the memory interface 33 as the transfer data received from the transmitting device 2 (step S26).

Meanwhile, if the DC balance inverse conversion is impossible at step S24 (step S24: No) or if an error is detected in the error detection process (step S25: Yes), the error correction section 321c determines as to whether or not the variable n is equal to 10 (whether or not the determination processes of steps S23 to 25 are performed for all the bits of the error data) (step S27).

If it is determined that the variable n is not equal to 10 (step S28: No), the variable n is incremented by one (step S28), and the processes following step S23 are performed again. If the variable n is equal to 10 (step S27: Yes), retransmission of the packet is requested to the transmitting device 2 (step S29).

FIGS. 6A and 6B are diagrams showing a specific example of the error correction by the error correction section 321e. FIG. 6A shows 10-bit data of the transmission data transmitted by the transmitting device 2 and 10-bit data of the reception data received by the receiving device 3. FIG. 6B shows data acquired by inverting each 1 bit of the 10-bit data where an error occurs by the DC balance inverse conversion (hereinafter, merely referred to as 'inverse conversion') and 8-bit data corresponding thereto.

As shown in FIG. 6A, while the transmission data is '0010111011', the reception data is '0010110011'. That is, an error occurs in the 4th bit. In this case, the error is detected in the error detection process based on the error detection code, and the error correction process is performed by the error correction section 321c.

The error correction section 321c sequentially generates inverted data acquired by inverting 1 bit of the reception data, and determines as to whether or not the inverted data can be inversely converted and an error is not detected in the error detection process based on the error detection code, in the processes of steps S23 to S28 as shown in FIG. 6B.

In FIG. 6B, the inverted data acquired by inverting the n-th bit (n=1 to 10) of the error data, which includes the 1-bit error and which is received by the receiving device 3, are shown on the left side of FIG. 6B. The 8-bit data acquired by referring to the DC balance conversion table 322b with respect to the inverted data are shown on the right side of FIG. 6B. Also, in FIG. 6B, if 8-bit data corresponding to the inverted data does not exist in the DC balance conversion table 322b (if the inverse conversion is impossible), '---' is shown.

In the example shown in FIG. 6B, if the 1st bit (the least significant bit) or the 2nd bit is inverted, the inverse conversion is impossible. Thus, the determination result at step S24 is 'No'. If the 3rd bit is inverted, the 8-bit data ('244' expressed as a decimal number) corresponding to the inverted data exists. Thus, the determination result at step S24 is 'Yes'. However, an error is detected in the error detection process at step S25.

If the 4th bit is inverted, the 8-bit data ('20' expressed as a decimal number) corresponding to the inverted data is acquired, and the data coincides with the transmission data. Thus, an error is not detected in the error detection process at step S25. As a result, the data acquired by inverting the 4th bit is adopted as error corrected data, and data including the 8-bit data are output to the memory interface 33 as the transfer data transmitted from the transmitting device 2.

The memory interface 33 stores the transfer data in the memory 34. Also, the memory interface 33 outputs the transfer data stored in memory 34 in response to a reading signal from the outside.

Second Exemplary Embodiment

Next, a second exemplary embodiment of the invention will be described with reference to FIG. 7. The second exemplary embodiment is different in processing contents of the error correction section 321c from the first exemplary embodiment, and the other process contents and the configuration of the data transmitting device 1 are the same as those in the first exemplary embodiment.

More specifically, in the first exemplary embodiment, if such inverted data is not obtained that it is obtained by inverting each 1 bit of error data, that it can be inversely converted, and that no error is detected in it, retransmission of data is requested to the transmitting device 2. However, in the second exemplary embodiment, if such inverted data is not obtained that it is obtained by inverting each 1 bit of error data, that it can be inversely converted, and that no error is detected in it, inverted data obtained by inverting plural bits of the error data is generated. Then, it is determined as to whether or not the inverted data obtained by inverting the plural bits can be inversely converted and whether or not an error is detected in the error detection process based on the error detection code. If the inverted data, which can be inversely converted and which has no error is obtained, such inverted data is output as error corrected data.

FIG. 7 is a flowchart showing an example of the error correction process performed by the error correction section 321c according to the second exemplary embodiment. Since the processes in steps S21 to S28 in the flowchart are the same as those which have been described with reference to FIG. 4 in the first exemplary embodiment, description thereof will be omitted.

The error correction section 321c according to the second exemplary embodiment performs a second determination process of steps S30 to S38 following the first determination process shown in steps S21 to S28.

If n=10 at step S27 (step S27: Yes), the error correction section 321c substitutes 2 for a variable m and substitutes 1 for the variable n (step S30), and inverts the m-th bit and the n-th bit of the error data (step S31).

Next, the error correction section 321c determines as to whether or not the inverted data generated at step S31 can be inversely converted (step S32), and determines as to whether or not an error is detected in the error detection process based on the error detection code (step S33). If it is determined that the inverse conversion is possible and that an error is not detected (step S32: Yes and step S33: No), the data are output to the memory interface 33 as the transfer data received from the transmitting device 2 (step S26).

If the inverse conversion is impossible (step S32: No) or if an error is detected in the error detection process (step S33: Yes), the error correction section 321c determines as to whether or not the variable m is equal to 10 and the variable n is equal to 9, that is, whether or not the determinations of steps S32 and S33 are made for all 2-bit combinations (45 types) among the 10 bits of the error data (step S34). If such inverted data is not obtained that it is obtained by inverting each 2 bit, that it can be inversely converted, and that an error is not detected in it (step S34: Yes), retransmission of the packet is requested to the transmitting device 2 (step S35).

If this is not the case where the variable m is equal to 10 and the variable n is equal to 9 (step S34: No), the error correction section 321c increments the variable n by one (step S36). If the variable n is equal to the variable m as a result of the increment (step S37: Yes), the error correction section 321c increments the variable m by one and substitutes 1 for the variable n (step S38). As described above, after the variables m and n are changed, the processes following step S31 are repetitively performed.

Other Exemplary Embodiments

The invention is not limited to the above-described exemplary embodiments, and various modifications may be made without departing from the scope of the invention.

For example, in the first and second exemplary embodiments, it is determined as to whether or not an error exists in the error detection process every time it is determined that the inverted data can be inversely converted. However, 8-bit data which can be inversely converted among the inverted data obtained by inverting each 1 bit or 2 bit of the error data may be stored, and after the inverse conversion of each inverted data is completed, it may be determined as to whether or not an error is detected in the error detection process with respect to each stored 8-bit data.

Further, in the second exemplary embodiment, if such data is not obtained that it is obtained by inverting each 2 bit of the error data, that it can be inversely converted and that it has no error, retransmission is requested. However, the invention is not limited thereto. I may be determined as to whether or not inverted data obtained by inverting 3 bits can be inversely converted and whether or not an error is detected in the error detection process.

Further, in the first and second exemplary embodiments, if the number of 10-bit data which cannot be inversely converted in the reception data is one (when the error counter is 1 at step S11), the error correction process is performed. However, the invention is not limited thereto. If the error counter indicates two or more, 1 bit or plural bits of each of the plural pieces of error data may be inverted, the DC balance inverse conversion is performed, and data in which an error is not detected in the error detection process may be extracted.

Also, in the first and second exemplary embodiments, the case where the 8 B/10 B conversion is performed by the transmitting device 2, and the 8 B/10 B inverse conversion is performed by the receiving device 3 has been described. However, the invention is not limited thereto. For example, the transmitting device 2 may perform a conversion process for encryption according to a predetermined procedure, and the receiving device 3 am inverse conversion process may be performed according to a predetermined decrypting procedure corresponding to the encrypting procedure performed by the transmitting device 2.

Also, in the first and second exemplary embodiments, the processes of the DC balance inverse conversion section, the error detection section, and the error correction section are implemented by the program. However, the corresponding processes may be implemented by hardware such as an application specific integrated circuit (ASIC).

Further, the program 322a may be recorded in a non-transitory computer readable recording medium such as a CD-ROM.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A data receiving device comprising:
a processor, the processor comprising:
   a receiving unit that receives converted data, which is obtained by converting data including
   transfer data of a plurality of bits, and
   an error detection code for error detection of the transfer data according to a predetermined first procedure;
   an inverse conversion unit that inversely converts the converted data received by the receiving unit according to a predetermined second procedure; and
   an error correction unit, wherein the error correction unit:
      performs a first determination of as to whether it is impossible for the inverse conversion unit to inversely convert the converted data because there is not corresponding data in a predetermined conversion table,
      when the first determination indicates that it is impossible for the inverse conversion unit to inversely convert the converted data, performs a second determination of as to whether it is possible for the inverse conversion unit to inversely convert partially inverted data obtained by inverting a portion of the bits of the converted data because there is corresponding data in the predetermined conversion table,
      when the second determination indicates that possible for inverse conversion unit to inversely convert the partially inverted data, performs a third determination of as to whether an error is not detected in data obtained by inversely converting the partially inverted data based on the error detection code, and
      when the third determination indicates that the error is not detected in the data obtained by inversely converting the partially inverted data, employs the data as correct data.

2. The data receiving device according to claim 1, wherein the inverse conversion unit inversely converts the converted data received by the data receiving section in data units of plural bits, the error correction unit generates the inverted data by inverting a portion of the plural bits of data unit which it is impossible for the inverse conversion unit to inversely convert, and if it is possible for the inverse conversion unit to inversely convert the inverted data and if an error is not detected in the data obtained by inversely converting the inverted data based on the error detection code, the error correction unit performs the error correction by inversely converting the inverted data.

3. The data receiving device according to claim 2, wherein the error correction unit generates inverted data by inverting each one bit of the plural bits of the data unit which it is impossible for the inverse conversion unit to inversely convert, the error correction unit performs a first determination process of determining as to whether or not it is possible for the inverse conversion unit to inversely convert each inverted data having the one bit thereof inverted and an error is not detected in data obtained by inversely converting each inverted data having the one bit thereof inverted, and if such data unit is not obtained in the first determination process that it is possible for the inverse conversion unit to inversely covert the data unit and that an error is not detected in data obtained by inversely converting the data unit, the error correction unit generates inverted data by inverting two or more bits of the data unit which it is impossible for the inverse conversion unit to inversely convert, and performs a second determination process of determining as to whether or not it is possible for the inverse conversion unit to inversely convert the data unit having the two or more bits thereof converted and an error is not detected in data obtained by inversely converting the data unit having the two or more bits thereof converted.

4. A data transfer apparatus comprising:
the data receiving device claim 1; and
a transmitting device that generates data, which includes
transfer data of a plurality of bits, and
an error detection code for error detection of the transfer data,
according to a predetermined first procedure, wherein the transmitting device transmits converted data obtained by converting the generated data.

5. A data receiving method comprising:
receiving converted data, which is obtained by converting data including
transfer data of a plurality of bits, and
an error detection code for error detection of the transfer data according to a predetermined first procedure;
inversely converting the received converted data according to a predetermined second procedure; and
performing error correction by:
performing a first determination of as to whether it is impossible for the inverse conversion unit to inversely convert the converted data because there is not corresponding data in a predetermined conversion table,
when the first determination indicates that it is impossible for the inverse conversion unit to inversely convert the converted data, performing a second determination of as to whether it is possible for the inverse conversion unit to inversely convert partially inverted data obtained by inverting a portion of the bits of the converted data because there is corresponding data in the predetermined conversion table,
when the second determination indicates that it is possible for the inverse conversion unit to inversely convert the partially inverted data, performing a third determination of as to whether an error is not detected in data obtained by inversely converting the partially inverted data based on the error detection code, and
when the third determination indicates that the error is not detected in the data obtained by inversely converting the partially inverted data, employing the data as correct data.

6. A non-transitory computer readable recording medium storing a program that causes a computer to execute a receiving process comprising:
receiving converted data, which is obtained by converting data including
transfer data of a plurality of bits, and
an error detection code for error detection of the transfer data according to a predetermined first procedure;
inversely converting the received converted data according to a predetermined second procedure; and
performing error correction by:
performing a first determination of as to whether it is impossible for the inverse conversion unit to inversely convert the converted data because there is not corresponding data in a predetermined conversion table,
when the first determination indicates that it is impossible for the inverse conversion unit to inversely convert the converted data, performing a second determination of as to whether it is possible for the inverse conversion unit to inversely convert partially inverted data obtained by inverting a portion of the bits of the converted data because there is corresponding data in the redetermined conversion table,
when the second determination indicates that it is possible for the inverse conversion unit to inversely convert the partially inverted data, performing a third determination of as to whether an error is not detected in data obtained by inversely converting the partially inverted data based on the error detection code, and
when the third determination indicates that the error is not detected in the data obtained by inversely converting the partially inverted data, employing the data as correct data.

* * * * *